(12) United States Patent
Yamaguchi et al.

(10) Patent No.: US 7,683,429 B2
(45) Date of Patent: Mar. 23, 2010

(54) MICROSTRUCTURE AND MANUFACTURING METHOD OF THE SAME

(75) Inventors: Mayumi Yamaguchi, Kanagawa (JP); Konami Izumi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 11/420,344

(22) Filed: May 25, 2006

(65) Prior Publication Data
US 2006/0267153 A1 Nov. 30, 2006

(30) Foreign Application Priority Data
May 31, 2005 (JP) ............................. 2005-160608

(51) Int. Cl.
*H01L 21/30* (2006.01)
(52) U.S. Cl. .................. 257/347; 257/415; 257/417; 257/420; 257/619; 257/E29.295; 257/E29.324
(58) Field of Classification Search ............... 257/619, 257/415, 417, 420, 347
See application file for complete search history.

(56) References Cited

U.S. PATENT DOCUMENTS

| | | | |
|---|---|---|---|
| 5,403,772 A | 4/1995 | Zhang et al. | |
| 5,643,826 A | 7/1997 | Ohtani et al. | |
| 5,796,152 A * | 8/1998 | Carr et al. | ............ 257/415 |
| 5,888,858 A | 3/1999 | Yamazaki et al. | |
| 5,985,740 A | 11/1999 | Yamazaki et al. | |
| 6,054,745 A * | 4/2000 | Nakos et al. | ............ 257/415 |
| 6,063,654 A | 5/2000 | Ohtani | |
| 6,077,731 A | 6/2000 | Yamazaki et al. | |
| 6,093,934 A | 7/2000 | Yamazaki et al. | |
| 6,100,562 A | 8/2000 | Yamazaki et al. | |
| 6,156,585 A * | 12/2000 | Gogoi et al. | ............ 438/48 |
| 6,180,439 B1 | 1/2001 | Yamazaki et al. | |
| 6,448,622 B1 * | 9/2002 | Franke et al. | ............ 257/415 |
| 6,465,287 B1 | 10/2002 | Yamazaki et al. | |
| 6,528,820 B1 | 3/2003 | Yamazaki et al. | |

(Continued)

FOREIGN PATENT DOCUMENTS

JP 10-107339 4/1998

(Continued)

OTHER PUBLICATIONS

Gianchadani et al., ("Gianchadani") J. Micromech. Microeng. 10 (2000) 380-386.*

(Continued)

*Primary Examiner*—A. Sefer
(74) *Attorney, Agent, or Firm*—Fish & Richardson P.C.

(57) ABSTRACT

A microstructure which forms a micromachine is formed by using a silicon wafer as a mainstream, conventionally. In view of this, the invention provides a manufacturing method of a micromachine in which a microstructure is formed over an insulating substrate.

The invention provides a micromachine including a layer containing polycrystalline silicon which is crystallized by thermal crystallization or laser crystallization using a metal element and including a space over or under the layer. Such polycrystalline silicon can be formed over an insulating surface and has high strength, therefore, it can be used as a microstructure as well. As a result, a microstructure formed over an insulating substrate or a micromachine provided with a microstructure can be provided.

16 Claims, 10 Drawing Sheets

U.S. PATENT DOCUMENTS

| | | | |
|---|---|---|---|
| 6,744,069 B1 | 6/2004 | Yamazaki et al. | |
| 6,813,054 B2 | 11/2004 | Aksyuk et al. | |
| 6,860,939 B2 | 3/2005 | Hartzell | |
| 6,900,082 B2* | 5/2005 | Wong et al. | 438/149 |
| 7,056,381 B1 | 6/2006 | Yamazaki et al. | |
| 2003/0058069 A1* | 3/2003 | Schwartz et al. | 335/78 |
| 2003/0104649 A1* | 6/2003 | Ozgur et al. | 438/50 |
| 2003/0196590 A1 | 10/2003 | Hartzell | |
| 2003/0196591 A1 | 10/2003 | Hartzell | |
| 2003/0196592 A1 | 10/2003 | Hartzell | |
| 2003/0196593 A1 | 10/2003 | Hartzell | |
| 2003/0197214 A1 | 10/2003 | Hartzell | |
| 2003/0199177 A1 | 10/2003 | Hartzell | |
| 2003/0217915 A1* | 11/2003 | Ouellet et al. | 204/192.15 |
| 2004/0056742 A1* | 3/2004 | Dabbaj | 335/78 |
| 2004/0164423 A1* | 8/2004 | Sherrer | 257/774 |
| 2004/0166655 A1 | 8/2004 | Wong et al. | |
| 2004/0183603 A1* | 9/2004 | Ma et al. | 331/68 |
| 2005/0034822 A1* | 2/2005 | Kim et al. | 159/5 |
| 2005/0079711 A1* | 4/2005 | Busta | 438/689 |
| 2005/0130360 A1 | 6/2005 | Zhan | |
| 2005/0153475 A1 | 7/2005 | Hartzell | |
| 2005/0205515 A1 | 9/2005 | Saga et al. | |
| 2006/0181368 A1 | 8/2006 | Naniwada | |
| 2006/0210106 A1 | 9/2006 | Pedersen | |
| 2006/0218785 A1 | 10/2006 | Horiuchi et al. | |
| 2006/0270238 A1* | 11/2006 | Izumi et al. | 438/700 |
| 2006/0273065 A1* | 12/2006 | Kim et al. | 216/2 |
| 2006/0284183 A1* | 12/2006 | Izumi et al. | 257/75 |
| 2007/0015361 A1* | 1/2007 | Tateishi | 438/689 |

FOREIGN PATENT DOCUMENTS

| | | |
|---|---|---|
| JP | 11-340477 | 12/1999 |
| JP | 2000-208018 | 7/2000 |
| JP | 2004-001201 | 1/2004 |

OTHER PUBLICATIONS

N. Fujitsuka, and J. Sakata, "A New Processing Technique to Prevent Stiction Using Silicon Selective Etching for SOI-MEMS", R&D Review of Toyota CRDL, vol. 36, No. 4, pp. 55-59 with partial English translation.

N. Fujitsuka, and J. Sakata, "New Processing Technique to Prevent Stiction Using Silicon Selective Etching for SOI-MEMS", Dec. 2001, R&D Review of Toyota CRDL, vol. 36, No. 4, pp. 55-59 with partial English translation.

Office Action (Chinese Patent Application No. 200610087708.0) with English translation; Apr. 17, 2009, 16 pages.

* cited by examiner

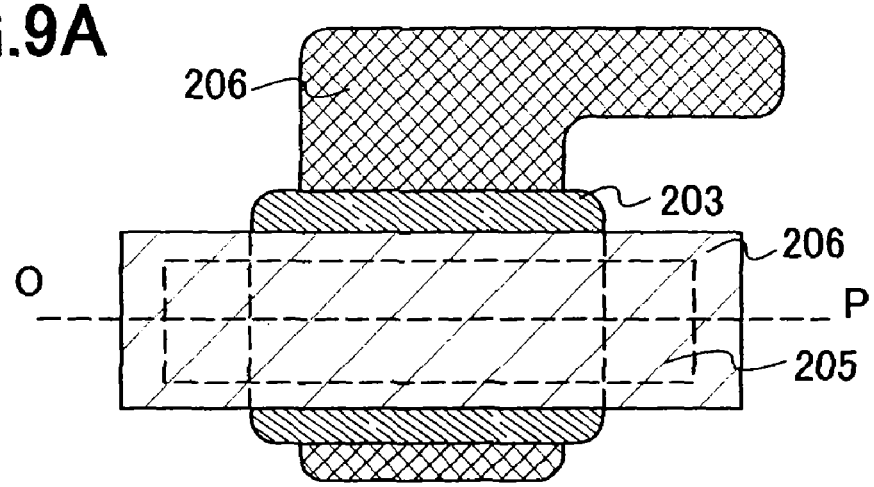
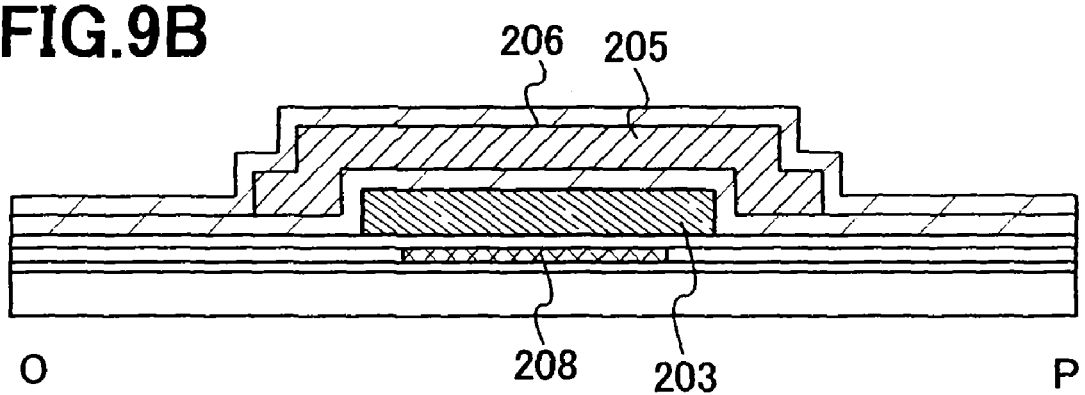

MICROSTRUCTURE AND MANUFACTURING METHOD OF THE SAME

BACKGROUND OF THE INVENTION

1. Field of the Invention

The present invention relates to a microstructure formed over an insulating surface and a manufacturing method thereof.

2. Description of the Related Art

In recent years, a micro mechanical system called MEMS (Micro Electro Mechanical System) is actively researched. MEMS is an abbreviated name of a micro electro mechanical system, which is sometimes simply called a micromachine. A micromachine in general corresponds to a minute device in which "a movable microstructure having a three-dimensional structure" and "an electric circuit having a semiconductor element" are integrated. The aforementioned microstructure has a three-dimensional structure and a movable portion, and further has a function as a switch, a variable capacitor, an actuator, or the like.

A micromachine can control its microstructure by using an electric circuit. Therefore, it is said that an autonomous decentralized type system can be formed which performs a series of operations by processing data, which is obtained by a sensor, by an electric circuit and executing the operation through an actuator or the like, instead of a central processing control type system such as a conventional device using a computer.

Many researches have been made of the aforementioned micromachine (see Patent Document 1). Patent Document 1 discloses a mechanical device in a thin film form which is crystallized.

[Patent Document 1]

Japanese Patent Laid-Open No. 2004-1201

SUMMARY OF THE INVENTION

A microstructure which forms a micromachine is formed by a process for manufacturing a semiconductor element using a silicon wafer. In particular, a micromachine which is in practical use is formed by using a silicon wafer in order to obtain enough thickness and strength for manufacturing the structure as a mainstream. However, in the case of forming a microstructure, a different process than the case of forming a semiconductor element is employed, such as sacrificial layer etching.

Further, reduction in manufacturing cost is demanded in view of the mass production of a micromachine having a microstructure.

In view of this, the invention provides a microstructure which is not formed over a silicon wafer, and a micromachine having the microstructure. Moreover, the invention provides a manufacturing method of a microstructure and a micromachine.

In order to achieve the aforementioned objects, a microstructure which forms a micromachine of the invention (hereinafter referred to as a semiconductor device) includes a layer containing polycrystalline silicon formed by thermal crystallization or laser crystallization using a metal element, and a space (also called a hollow) under or over the layer. Such polycrystalline silicon which can be formed over an insulating surface represented by a glass substrate and has high strength can be used as a microstructure.

The space may have a single layer structure or a stacked-layer structure. Such a space is formed by removing a sacrificial layer using an etchant introduced through a contact hole. Therefore, when seen in a cross sectional view of a semiconductor device, the spaces in a stacked-layer structure are preferably connected through a contact hole or the like. As a result, the number of steps to remove the sacrificial layer can be reduced.

By forming such a space, a semiconductor device including a movable layer containing polycrystalline silicon can be provided. Being movable means to move in top, bottom, left, and right directions and to pivot about a certain axis. Pressure, electrostatic force, or electromagnetic force can be used to achieve the movable function.

The invention will be specifically described below.

According to one mode of the invention, a microstructure includes a first layer provided over an insulating surface and a second layer containing polycrystalline silicon provided over the first layer. The polycrystalline silicon is crystallized by using a metal element. There is a space between the first layer and the second layer.

According to another mode of the invention, a microstructure includes a first layer provided over an insulating surface and a second layer containing polycrystalline silicon provided over the first layer. The polycrystalline silicon is crystallized by using a metal element. A layer containing a metal, a metal compound, silicon, a silicon oxide, or a silicon nitride, which is provided over the first layer is removed by etching. There is a space between the first layer and the second layer.

According to another mode of the invention, a microstructure includes a first layer provided over an insulating surface and a second layer containing polycrystalline silicon provided over the first layer. The polycrystalline silicon is crystallized by using a metal element. A layer containing a metal, a metal compound, silicon, a silicon oxide, or a silicon nitride, which is provided over the first layer is removed by etching. The second layer has a portion which is not in contact with the insulating surface or the first layer.

According to another mode of the invention, a microstructure includes a first layer provided over an insulating surface and a second layer containing polycrystalline silicon provided over the first layer. The polycrystalline silicon is crystallized by using a metal element. A layer containing a metal, a metal compound, silicon, a silicon oxide, or a silicon nitride, which is provided over the first layer is removed by etching. The second layer has a beam structure where a portion thereof is not in contact with the insulating surface or the first layer.

In the invention, the second layer can have a structure where polycrystalline silicon and amorphous silicon are stacked. Moreover, in the invention, the second layer may have a structure where polycrystalline silicon layers with different crystallinity are stacked.

According to another mode of the invention, a manufacturing method of a microstructure includes steps of forming a layer containing amorphous silicon over an insulating surface, crystallizing the amorphous silicon by using a metal element into polycrystalline silicon, and forming a space over or under the layer containing the polycrystalline silicon.

According to another mode of the invention, a manufacturing method of a microstructure includes steps of forming a first layer over an insulating surface, forming a third layer over the first layer, forming a second layer containing amorphous silicon over the third layer, crystallizing the amorphous silicon by using a metal element into the polycrystalline silicon, and removing the third layer by etching.

According to another mode of the invention, a manufacturing method of a microstructure includes steps of forming a first layer over an insulating surface, forming a third layer over the first layer, forming a second layer containing amorphous silicon over the third layer, crystallizing the amorphous silicon by using a metal element into polycrystalline silicon, forming an insulating layer covering the polycrystalline silicon, forming a contact hole in the insulating layer, and removing the third layer by etching the third layer by introducing etchant through the contact hole.

According to another mode of the invention, a manufacturing method of a microstructure includes steps of forming a first layer over an insulating surface, forming a third layer over the first layer, forming a second layer containing amorphous silicon over the third layer, crystallizing the amorphous silicon by using a metal element into polycrystalline silicon, and removing the third layer by etching, so that the second layer has a portion which is not in contact with the insulating surface or a layer formed over the insulating surface is formed.

According to another mode of the invention, a manufacturing method of a microstructure includes steps of forming a first layer over an insulating surface, forming a third layer over the first layer, forming a second layer containing amorphous silicon over the third layer, crystallizing the amorphous silicon by using a metal element into polycrystalline silicon, and removing the third layer by etching, so that the second layer has a beam structure.

According to another mode of the invention, a manufacturing method of a microstructure includes steps of forming a first layer over an insulating surface, forming a third layer over the first layer, forming a second layer containing amorphous silicon over the third layer, crystallizing the amorphous silicon by using a metal element into polycrystalline silicon, and removing the third layer by etching, so that the second layer has a beam structure and becomes movable by pressure, electrostatic force, or electromagnetic force.

In the invention, thermal crystallization or laser crystallization can be used for crystallization. Moreover, polycrystalline silicon which is selectively crystallized may be formed by applying a metal element to a portion of amorphous silicon. Furthermore, polycrystalline silicon which is selectively crystallized may be formed by irradiating a portion of the amorphous silicon with laser.

The invention can provide a microstructure which can resist external force and stress and can further control conductivity, by using polycrystalline silicon crystallized by using a metal element for a structure layer of the microstructure.

BRIEF DESCRIPTION OF DRAWINGS

FIGS. 9A and 9B are views showing manufacturing steps of a microstructure of the invention.

DETAILED DESCRIPTION OF THE INVENTION

Figure 1A:
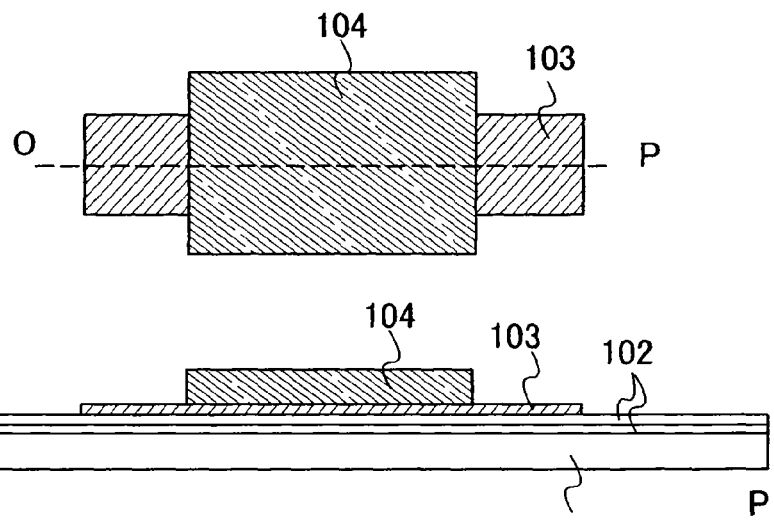
FIGS. 1A to 1C are views showing manufacturing steps of a microstructure of the invention.

Although the present invention will be fully described by way of embodiment modes and embodiment with reference to the accompanying drawings, it is to be understood that various changes and modifications will be apparent to those skilled in the art. Therefore, unless such changes and modifications depart from the scope of the invention, they should be construed as being included therein. Note that reference numerals denoting the same portions are commonly used in different drawings.

Embodiment Mode 1

In this embodiment mode, a structure example and a manufacturing method of a semiconductor device having a microstructure of the invention will be described with reference to the drawings.

A semiconductor device including a microstructure of the invention belongs to a field of a micromachine and its size ranges from several micrometers to several millimeters. A semiconductor device including a microstructure of the invention is manufactured into a size of several meters when manufactured to be incorporated as a component of a certain device, for the ease of assembling.

Figure 6:
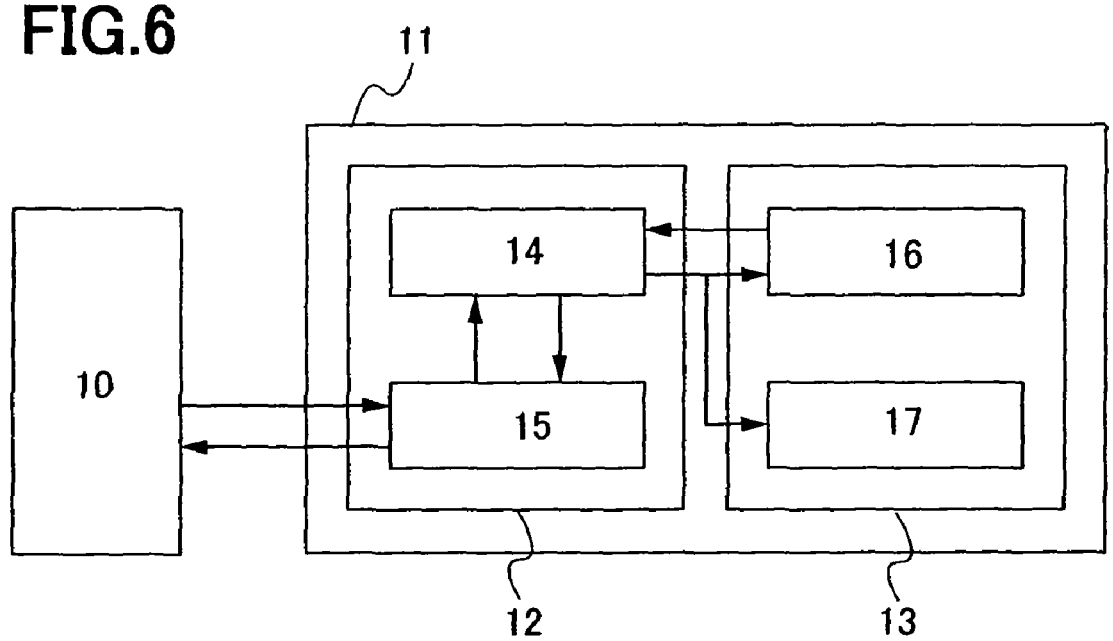
FIG. 6 is a view showing a semiconductor device having a microstructure of the invention.

FIG. 6 is a schematic diagram of a semiconductor device including a microstructure of the invention.

A semiconductor device 11 of the invention can be used in combination with an electric circuit portion 12 including a semiconductor element and a structure portion 13 constituted by a microstructure. The electric circuit portion 12 includes a control circuit 14 which controls a microstructure, an interface 15 which communicates with an external control device 10. The structure portion 13 includes a sensor 16, an actuator 17, a switch, or the like each formed of a microstructure. An actuator is an element which converts a signal (mainly an electric signal) into a physical value.

The electric circuit portion 12 may include a central processing unit or the like for processing data obtained by the structure portion 13.

The external control device 10 performs such operations as transmitting a signal to control the semiconductor device 11, receiving data obtained by the semiconductor device 11, or supplying a driving power to the semiconductor device 11.

A semiconductor device including a microstructure of the invention is not limited to the aforementioned structure example. That is, the invention includes a microstructure controlled by an electric circuit and provides a novel microstructure.

In a conventional way, in the case of processing a minute object having a size of several millimeters or smaller, such a process is required that the structure of the object is enlarged, a human or a computer obtains the data and determines the process and operations, scaling down the operation, and transmit it to the minute object.

However, a semiconductor device including a microstructure of the invention can process a minute object simply by giving an abstract instruction by a human or a computer. That is, when a human or a computer determines a purpose and gives an instruction, a semiconductor device including a microstructure obtains data of the object, processes data, thereby the operation can be performed.

In the aforementioned example, the object is assumed to be minute. This means that the object itself has a size of several meters, but includes a minute signal (for example, a minute change in light or pressure) or the like generated from the object.

Next, a manufacturing method of a microstructure of the invention is described with reference to the drawings. In the drawing, the upper side shows a top plan view while the lower side shows a cross sectional view along O-P of the top plan view.

A minute structure of the invention is formed over a substrate having an insulating surface (hereinafter referred to as an insulating substrate). An insulating substrate includes a glass substrate, a quartz substrate, a plastic substrate, or the like. Moreover, it is possible to use a conductive substrate such as a metal or a semiconductor substrate such as a silicon substrate over which an insulating layer is formed. By forming a microstructure over a plastic substrate, a semiconductor device which is highly flexible and thin can be formed. Further, by forming a glass substrate thin by grinding or the like, a thin semiconductor device can also be formed.

First, a base film 102 is formed over a substrate 101 having an insulating surface (see FIG. 1A). The base film 102 can be formed of a single layer or a stacked-layer structure of an insulating layer such as a silicon oxide film, a silicon nitride film, or a silicon oxynitride film. In this embodiment mode, two-layer structure is employed for the base film 102, however, a single layer structure or a stacked-layer structure of two or more layers may also be employed.

As a first layer of the base film 102, a silicon oxynitride film can be formed with a thickness of 10 to 200 nm (preferably 50 to 100 nm) by a plasma CVD method using $SiH_4$, $NH_3$, $N_2O$, and $H_2$ as a reactive gas. In this embodiment mode, a silicon oxynitride film is formed with a thickness of 50 nm. Subsequently, as a second layer of the base film 102, a silicon oxynitride film can be formed with a thickness of 50 to 200 nm (preferably 100 to 150 nm) by a plasma CVD method using $SiH_4$ and $N_2O$ as a reactive gas. In this embodiment mode, a silicon oxynitride film is formed with a thickness of 100 nm.

Next, an amorphous silicon film or a polycrystalline silicon film to be a first structure layer 103 which forms a microstructure is formed and patterned into a desired shape (see FIG. 1A). A polycrystalline silicon film can be formed of a material containing silicon. The material containing silicon includes a material formed of silicon and a silicon germanium material containing 0.01 to 4.5 atomic % of germanium. Moreover, the aforementioned silicon film may have a crystalline state or an amorphous state. In this embodiment mode, a polycrystalline silicon film crystallized by applying thermal treatment using a metal element to an amorphous silicon film is used. An annealing furnace, laser irradiation, or light irradiation generated from a lamp instead of laser light (hereinafter referred to as lamp annealing), or a combination thereof can be used for the thermal treatment.

A structure layer as described above may have a multilayer structure in order to obtain a required thickness. For example, a stacked-layer structure of polycrystalline silicon can be formed by repeating the deposition of an amorphous silicon film and crystallization by thermal treatment. By this thermal treatment, a stress in the polycrystalline silicon film which is formed in advance is alleviated, thereby the peeling of a film and deformation of a substrate can be prevented. Further, patterning can also be repeated together in order to further alleviate the stress in the film.

A structure layer may be formed by stacking films having different crystallinity. For example, a stacked-layer structure of an amorphous silicon film and a polycrystalline silicon film can be employed.

In the case of employing a stacked-layer structure in this manner, a thick structure layer cannot be deposited at one time when using a material having a large internal stress for the structure layer. In this case, a structure layer can be formed by repeating the deposition and patterning.

In the case of forming polycrystalline silicon by laser irradiation, a continuous wave laser beam (CW laser beam) or a pulsed wave laser beam (pulsed laser beam) can be used. As the laser beam, a laser beam oscillated from one or a plurality selected from Ar laser, Kr laser, excimer laser, YAG laser, $Y_2O_3$ laser, $YVO_4$ laser, YLF laser, $YAlO_3$ laser, glass laser, ruby laser, alexandrite laser, Ti: sapphire laser, copper vapor laser, and gold vapor laser can be used. By emitting a laser beam of second to fourth harmonics of a fundamental harmonic in addition to a fundamental harmonic of the foregoing laser beams, a crystal having a large grain diameter can be obtained. For instance, a second harmonic (532 nm) or a third harmonic (355 nm) of Nd: $YVO_4$ laser (fundamental, 1064 nm) can be used. The laser requires energy density of approximately from 0.01 to 100 $MW/cm^2$ (preferably, approximately from 0.1 to 10 $MW/cm^2$). The laser is emitted at a scanning rate of approximately from 10 to 2000 cm/sec.

A continuous wave fundamental harmonic laser beam and a continuous wave higher harmonic laser beam may be emitted. Alternatively, a continuous wave fundamental harmonic laser beam and a pulsed wave higher harmonic laser beam may be emitted. By emitting a plurality of laser beams, energy can be supplied.

A laser beam, which is a pulsed wave laser beam, and which can oscillate laser at an oscillation frequency capable of emitting laser light of a next pulse during the period between melting due to laser light and solidifying of the semiconductor film can also be used. By oscillating the laser beam at such a frequency, crystal grains that are continuously grown in the scanning direction can be obtained. A specific oscillation frequency of the laser beam is 10 MHz or higher. A notably higher frequency band is used than a frequency band of several tens to several hundreds Hz that is generally used.

In the case of using a heating furnace as another thermal treatment, an amorphous semiconductor film is heated at 400 to 550° C. for 2 to 20 hours. At this time, the temperature is preferably set at multi-steps in the range of 400 to 550° C. so as to increase gradually. By an initial low temperature heating process at about 400° C., hydrogen or the like in the amorphous semiconductor film is released. Accordingly, roughness of a film surface due to crystallization can be reduced. Moreover, a metal element that promotes crystallization, for example, nickel (Ni) is preferably formed over the amorphous semiconductor film since a heating temperature can be reduced. As a metal element, iron (Fe), ruthenium (Ru), rhodium (Rh), palladium (Pd), osmium (Os), iridium (Ir), platinum (Pt), copper (Cu), gold (Au), cobalt (Co), or the like can be used.

In addition to the heating furnace, laser irradiation as described above may be performed to form polycrystalline silicon.

By performing thermal treatment using a metal element, the polycrystalline silicon formed in this manner has almost the same crystal structure as that of single crystal silicon. As a result, the first structure layer 103 tougher than polycrystalline silicon formed by thermal treatment without using a metal element, which is capable of being used as a material for a structure layer can be formed. This is because polycrystalline silicon in which crystal grains are continuously formed can be formed by thermal treatment using a metal element. In polycrystalline silicon in which crystal grains are continuously formed, covalent crystal grain boundaries do not break, unlike amorphous silicon or polycrystalline silicon formed by thermal treatment without using a metal element. Therefore, a stress concentration due to a defect in a crystal grain boundary does not occur, which results in a larger fracture stress as compared to polycrystalline silicon formed without using a metal element. Further, as electron mobility is high due to continuous crystal grain boundaries, polycrystalline silicon in which crystal grains are continuously formed is suitable as a material used in the case of controlling a structure by electrostatic force.

Furthermore, the first structure layer 103 can have conductivity when a metal element for promoting crystallization is contained, which is suitable for a semiconductor device of the invention which controls a structure by electrostatic force.

Moreover, a metal element which becomes a contaminant source of a semiconductor device can be removed after crystallization. In this case, by forming a layer to be a gettering sink over a silicon film after thermal treatment using a metal element, the metal element can be moved into the gettering sink by heating. The gettering sink can be formed of a polycrystalline semiconductor film or a semiconductor film to which impurities are added. For example, a polycrystalline semiconductor film to which inactive elements such as argon are added can be formed over the semiconductor film and used as a gettering sink. By adding inactive elements, the polycrystalline semiconductor film can have a distortion, by which the metal element can be effectively captured. Further, by forming a semiconductor film to which elements such as phosphorus are added, the metal elements can be captured.

The first structure layer 103 formed by such steps can be used. In the case where the first structure layer 103 is required to be conductive, impurity elements such as phosphorus, arsenic, or boron can be added thereto. A structure having conductivity is suitable for a semiconductor device of the invention which has a conductive structure and is controlled by electrostatic force.

An impurity region may be formed in the first structure layer 103 to enhance the conductivity. The impurity region can be formed by forming a resist mask by a photolithography method and adding impurity elements thereto. The impurity elements can be added by an ion doping method or an ion implantation method. As an impurity element which imparts n-type conductivity, phosphorus (P) or arsenic (As) is typically used while boron (B) is used as an impurity element which imparts p-type conductivity. An n-type impurity region and a p-type impurity region can be formed by adding impurities at a concentration of $1 \times 10^{20}$ to $10^{21}/cm^3$.

After forming an impurity region, thermal treatment may be performed for activating impurity elements. The thermal treatment may be performed with the aforementioned conditions.

Next, a sacrificial layer 104 is formed and patterned into a desired shape (see FIG. 1A). The sacrificial layer 104 is formed by a sputtering method, a CVD method, or the like using a material, for example, a metal such as tungsten, a compound containing silicon (for example, a silicon oxide or a silicon nitride), and a metal compound of a metal and an element such as silicon. To pattern the layer, a resist mask is formed by a photolithography method and anisotropic dry etching is applied thereto. The sacrificial layer is a layer removed in a subsequent step. By removing the sacrificial layer, a space is formed. Such a sacrificial layer can be formed of a material containing a metal, a metal compound, silicon, a silicon oxide, or a silicon nitride. Further, a sacrificial layer may be a conductive layer or an insulating layer.

The thickness of the sacrificial layer 104 is determined in consideration of various factors such as a material of the sacrificial layer 104, a structure and an operating method of a structure, and an etching method for removing the sacrificial layer. For example, when the sacrificial layer 104 is too thin, it is not etched since an etchant does not disperse therein. Moreover, a phenomenon called sticking (also called adhering) of a structure layer formed over the sacrificial layer 104 may occur. Further, when a structure is operated by electrostatic force, it may not be able to be driven when a sacrificial layer is too thick. Therefore, in the case of driving a structure by electrostatic force, it is preferable that the sacrificial layer 104 have a thickness of 0.5 to 3 μm or more preferably 1 to 2.5 μm.

In the case of using a material with a large internal stress as a sacrificial layer, it is difficult to form a thick sacrificial layer at one time. In this case, a sacrificial layer can be formed thick by repeating the formation and patterning. That is, a sacrificial layer may have a single layer structure or a stacked-layer structure.

Figure 1B:
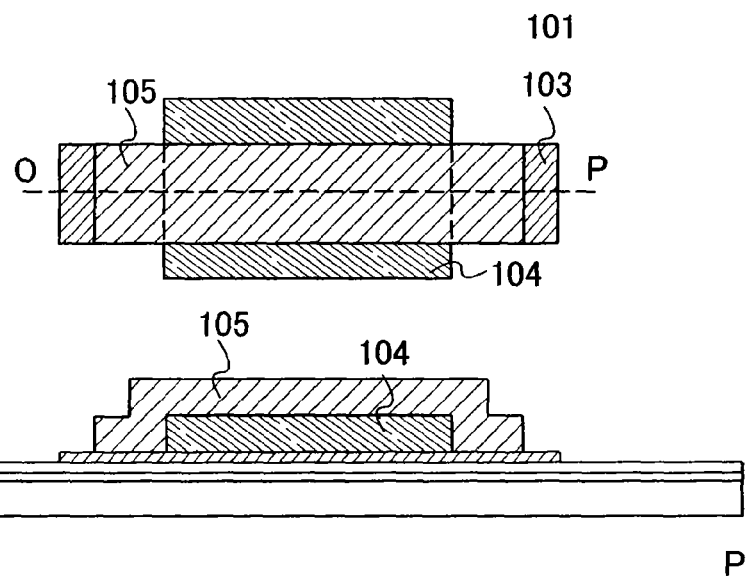

Next, a second structure layer 105 which forms a top portion of a microstructure is formed. The second structure 105 is formed by forming an amorphous silicon film or a polycrystalline silicon film and patterning it into a desired shape (see FIG. 1B). At this time, patterning is performed so that a portion of the sacrificial layer 104 is exposed (see a top plan view of FIG. 1B). The second structure layer 105 can be formed of a similar material and crystal structure to the first structure layer 103. A polycrystalline silicon layer can be formed by thermal treatment using a metal element similarly to the first structure layer 103.

Polycrystalline silicon formed by such steps can be used for the second structure layer 105. Containing a metal element used in the thermal treatment as it is, polycrystalline silicon can have conductivity. Further, when the second conductive layer 105 is required to be conductive, impurity elements can be added thereto similarly to the first structure layer 103.

After an impurity region is formed, impurity elements may be activated by a similar method to that of the first structure layer 103.

The second structure layer 105 may have a multi-layer structure similarly to the first structure layer 103 in order to obtain a required thickness.

The material and thickness of the second structure layer 105 can be determined in consideration of various factors such as the adhesiveness with the first structure layer 103, a thickness of the sacrificial layer 104, a material of the second structure layer 105, a constitution of the structure, and an etching method of the sacrificial layer. For example, in the case of forming the second structure layer 105 by using a silicon film of this embodiment mode, the thickness thereof is preferably 1 to 10 μm.

When such a material having a large difference in distribution of internal stress is used as a material for the second structure layer 105, the second structure layer 105 may curve. However, a structure can be formed by utilizing the curve of the second structure layer 105.

When the second structure layer 105 is formed thick, internal stress may be distributed therein, which causes a curve or sticking (also called adhering). On the other hand, when the second structure layer 105 is formed thin, a structure may stick to the underlying layer due to a surface tension of a solution used for etching the sacrificial layer. In consideration of these, the thickness of the second structure layer 105 can be determined.

Figure 1C:
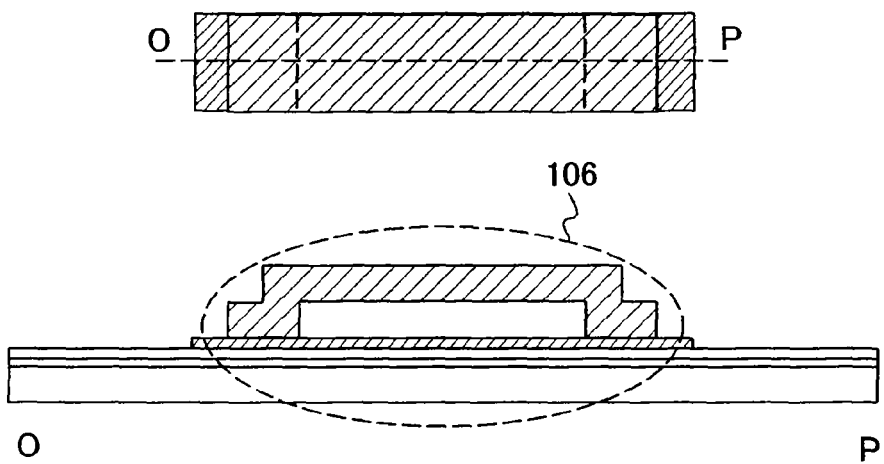

Next, the sacrificial layer 104 is removed by etching (see FIG. 1C). An etchant and an etching method suitable for the material of the sacrificial layer 104 can be used for the etching. The etching method is an wet etching method or a dry etching method.

For example, when a sacrificial layer is formed of tungsten (W), etching is performed by soaking the layer in a solution in which 28% of ammonium and 31% of hydrogen peroxide solution are mixed at a ratio of 1:2 for about 20 minutes. When a sacrificial layer is formed of silica dioxide, buffered hydrogen fluoride in which 49% of hydrofluoric acid solution and ammonium fluoride are mixed at a ratio of 1:7 is used.

After wet etching, drying can be performed by rinsing using an organic solvent (for example, cyclohexane) with low viscosity or can be performed at a low temperature and low pressure in order to prevent the sticking of a structure caused by a capillary phenomenon. Alternatively, these methods may be used in combination.

Further, dry etching can be performed to a sacrificial layer using $F_2$ and $XeF_2$ with a high pressure condition such as atmospheric pressure. It is also possible to apply plasma treatment so that the surface of a structure has a liquid-repellent property in order to prevent the sticking of the structure caused by a capillary phenomenon.

In this embodiment mode, as a portion of the sacrificial layer 104 is exposed, the sacrificial layer 104 can be removed without forming a contact hole.

Moreover, in the case of forming an insulating layer or the like so as to cover the second structure layer 105 and the sacrificial layer 104, the sacrificial layer 104 can be removed by forming a contact hole in the insulating layer and introducing an etchant through the contact hole.

By etching the sacrificial layer 104 by such steps, a structure 106 can be formed.

By etching the sacrificial layer 104, the structure 106 has a structure where the second structure layer 105 is not fixed or in contact to the substrate or the first structure layer 103 formed over the substrate. Such a structure is, for example, a beam structure as shown in FIG. 1C. A beam structure has a pillar portion and a beam portion.

Figure 2A:
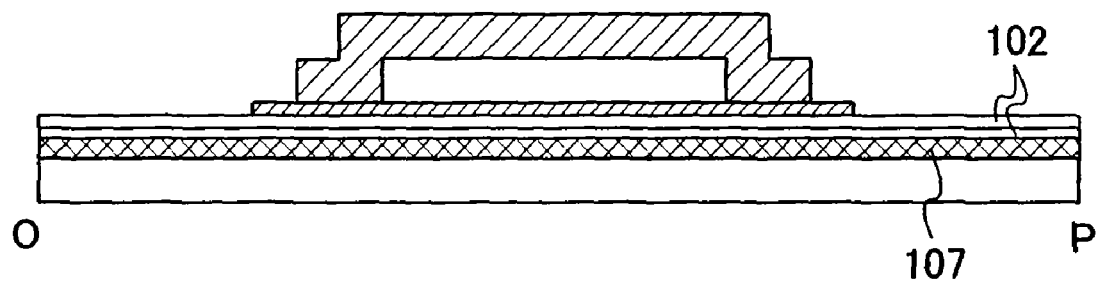
FIGS. 2A and 2B are views showing manufacturing steps of a microstructure of the invention.
Figure 2B:
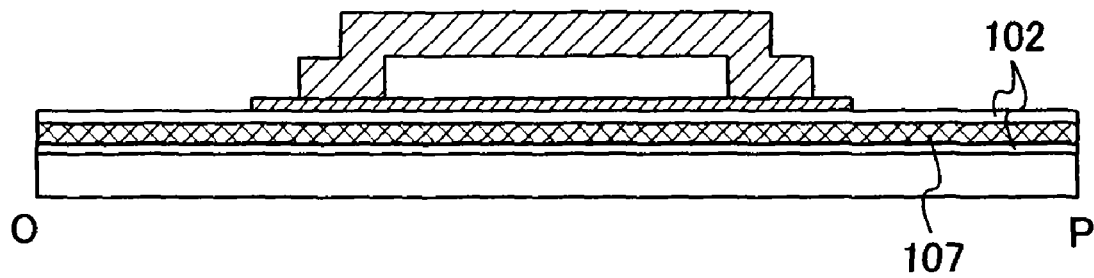

In the case where the structure 106 is movable by electrostatic force, a conductive layer 107 which can be used as a common electrode, a control electrode, and the like can be formed under the base film 102 (see FIG. 2A). Moreover, when the base film 102 has a stacked-layer structure, the conductive layer 107 can be formed between the layers of the base film 102 (see FIG. 2B). The conductive layer 107 can be formed by a CVD method or the like using a metal such as tungsten and a substance having conductivity as a material. Further, the conductive layer 107 may be patterned into a desired shape as required.

Figure 7A:
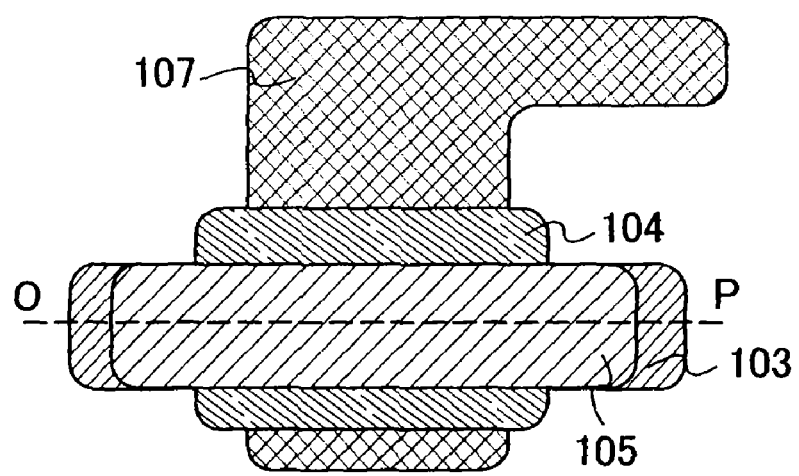
FIGS. 7A and 7B are views showing manufacturing steps of a microstructure of the invention.
Figure 7B:
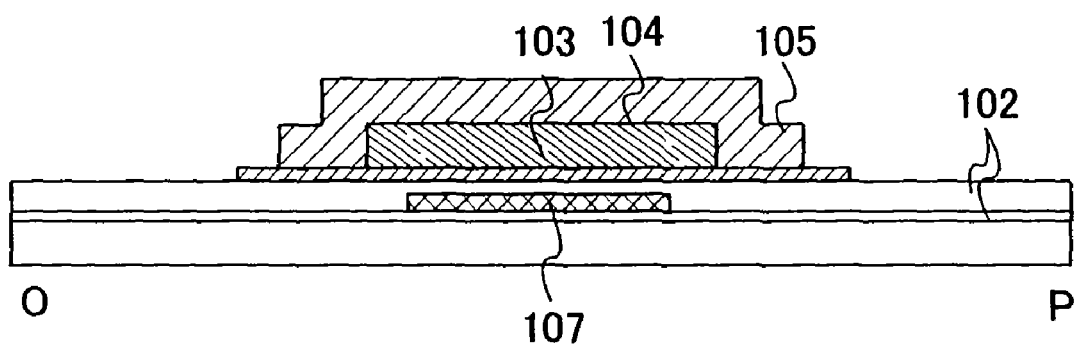

When a layer which forms the structure 106 has a pattern with corners when seen from the top, it is preferably patterned into a shape having rounded corners. This is similarly applied to the sacrificial layer 104 which is to be removed later. FIG. 7A is a top plan view where the conductive layer 107 and the sacrificial layer 104 are formed and patterned, and FIG. 7B is a sectional view thereof. By patterning the layer into a shape having rounded corners, dusts can be prevented and thus the yield can be improved.

In this manner, the layer which forms the structure 106 is preferably formed into as smooth a shape as possible. By forming the layer into a shape with no sharp portions, dusts can be prevented and a crack which causes breaking does not easily occur.

The second structure layer 105 is formed over the sacrificial layer 104 in the aforementioned steps, however, an insulating layer may be formed over the sacrificial layer 104 and then the second structure layer 105 may be formed thereover. That is, the invention features using polycrystalline silicon formed by using a metal element for a structure layer. The invention may have other configurations and is not particularly limited.

In this manner, by forming an insulating layer between the sacrificial layer 104 and the second structure layer 105, the insulating layer can protect the second structure layer 105, thereby reducing a damage to the second structure layer 105 when removing the sacrificial layer 104.

In the method for forming the structure 106 as described above, an appropriate combination of the materials of the first structure layer 103, the second structure layer 105, and the sacrificial layer 104, and the etchant to remove the sacrificial layer is determined. For example, when a specific etchant is determined, a material having a higher etching rate is preferably used to form the sacrificial layer 104 as compared to the materials of the first structure layer 103 and the second structure layer 105.

A polycrystalline silicon layer which forms the first structure layer 103 and the second structure layer 105 can be formed by stacking a layer containing polycrystalline silicon crystallized by the aforementioned steps and a layer containing amorphous silicon. In this manner, by employing a stacked-layer structure in a structure layer, a structure layer having flexibility and hardness in combination can be provided. Moreover, the balance of the flexibility and hardness can be determined by the ratio of the thicknesses of the stacked layers.

In general, a silicon alloy such as nickel silicide is known to have high strength. By leaving metal elements used for the thermal treatment of the semiconductor film selectively or entirely in the semiconductor film and applying appropriate thermal treatment thereto, a structure which is harder and has high conductivity can be formed.

By stacking the aforementioned layer in which metal elements used for crystallization are left therein and a layer containing polycrystalline silicon, a flexible material having superior conductivity can be obtained. By stacking a layer containing amorphous silicon and a layer containing silicide, a hard material which has superior conductivity can be provided.

In the case where metal elements are added to the entire surface of the layer and laser irradiation or thermal treatment is applied thereto, silicon crystals grow in a direction perpendicular to the substrate. Meanwhile, in the case where metal elements are selectively added to the layer and laser irradiation or thermal treatment is applied thereto, or the layer is crystallized without using a metal element, crystals grow in a direction parallel to the substrate. By stacking two or more of these layers having different crystal directions, a material which is superior in toughness can be provided. As the layers having different crystal directions are stacked, even when one layer cracks, the crack does not easily spread to the layer having a different crystal direction. As a result, the second structure layer 105 which has high strength and does not easily break can be formed.

A layer containing amorphous silicon, a layer containing polycrystalline silicon, or a layer containing nickel silicide may be repeatedly stacked so as to obtain a required thickness.

Figure 10A:
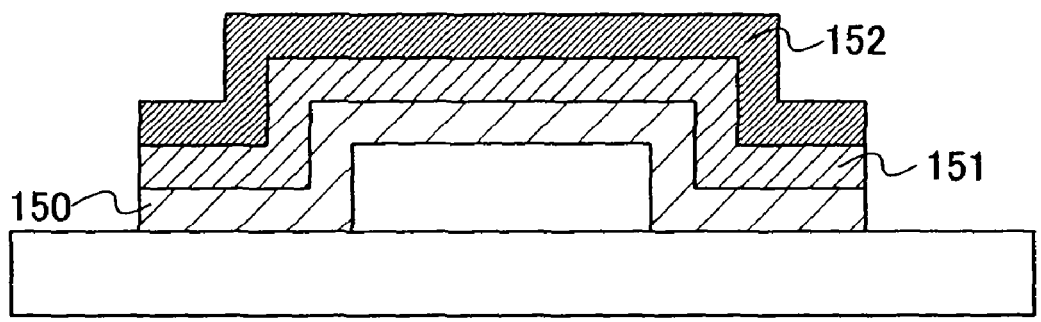
FIGS. 10A and 10B are views showing structures of a microstructure of the invention.

As shown in FIG. 10A, silicon and a silicon compound having various properties can be stacked. In FIG. 10A, a layer 150 containing amorphous silicon, a layer 151 containing polycrystalline silicon, and a layer 152 containing nickel silicide are stacked over the substrate 101. In the invention, a layer which forms a structure can be appropriately selected and stacked. The aforementioned steps to stack the layers can be easily carried out. Therefore, the second structure layer 105 having a desired property can be easily formed.

Further, the crystallization using a metal such as the aforementioned steps can be performed partially by applying a metal element selectively. For example, a metal may be applied only to the second structure layer 105 of a portion with the sacrificial layer 104 under thereof for crystallization.

Figure 10B:
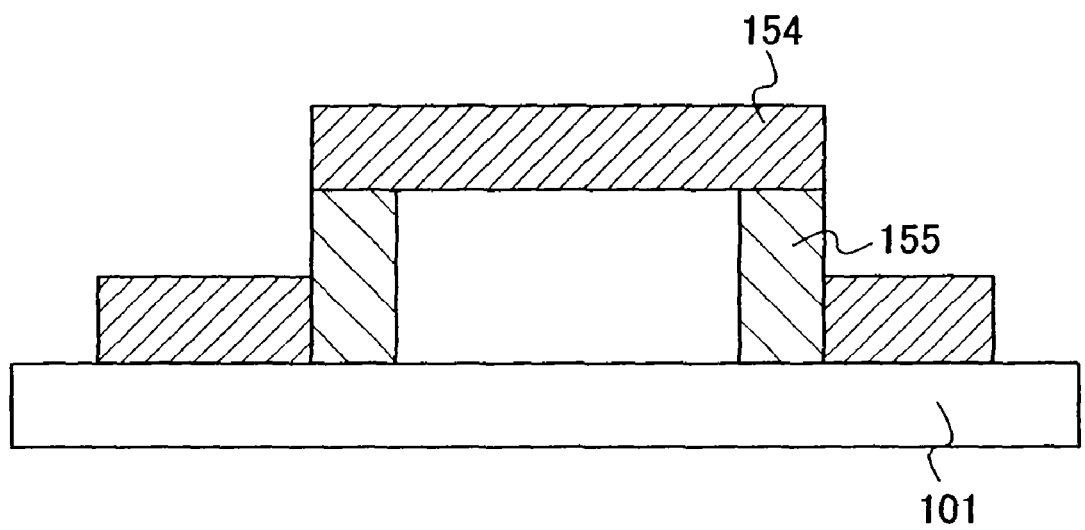

The crystallization as described above can be performed partially by irradiating the layer with laser selectively. For example, the second structure layer 105 of only a portion 154 with the sacrificial layer 104 under thereof can be crystallized. Further, by changing the laser conditions, it is possible to leave amorphous silicon only in a pillar portion 155 of the beam structure shown in FIG. 10B and crystallize the beam portion thereof. In this manner, a microstructure can be formed by using silicon with different crystallinity.

In the case where thermal treatment is performed by using a metal element such as the aforementioned steps, crystallization can be performed at a lower temperature as compared to thermal treatment without using a metal element, therefore, a substrate for forming the structure can have more choices of materials. For example, in the case of crystallizing a semiconductor film only by heat, it is required that the film be heated at about 1000° C. for about one hour. Therefore, a glass substrate which is sensitive to heat or a metal of which melting point is 1000° C. or lower cannot be used. However, by the aforementioned steps, a glass substrate of which distortion point is 593° C., or the like can be used.

In this manner, according to the invention, a microstructure can be formed over an insulating surface. An electric circuit which can be formed by the semiconductor element can control a microstructure. A semiconductor device having such a microstructure can be formed at reduced cost. Moreover, according to a manufacturing method of a semiconductor device of the invention, productivity can be improved as compared to a conventional structure where an electric circuit is separately formed and electrically connected to a microstructure.

Embodiment Mode 2

In this embodiment mode, a structure where polycrystalline silicon is sandwiched between insulating layers, which is different from the aforementioned mode, is described with reference to FIGS. 3A to 3C. In the drawing, the upper side shows a top plan view while the lower side shows a cross sectional view along O-P of the top plan view.

Figure 3A:
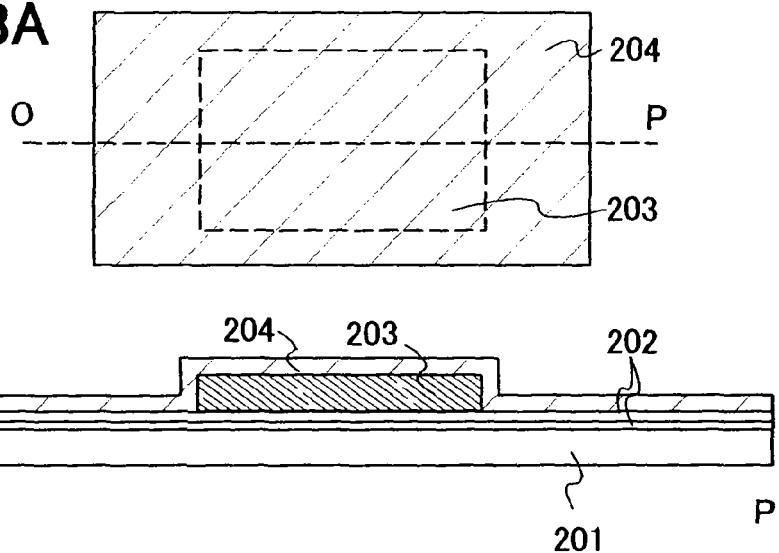
FIGS. 3A to 3C are views showing manufacturing steps of a microstructure of the invention.

As shown in FIG. 3A, base films 202 are formed over an insulating substrate 201 and a sacrificial layer 203 is formed thereover. For a manufacturing method of these films, Embodiment Mode 1 can be referred to. A first insulating layer 204 which forms a structure is formed. As the first insulating layer, an inorganic material or an organic material can be used. As an inorganic material, silicon oxide or silicon nitride can be used. As an organic material, polyimide, acrylic, polyamide, polyimide amide, benzocyclobutene, siloxane, or polysilazane can be used. Siloxane has a skeleton of a bond of silicon (Si) and oxygen (O). As a substituent, an organic group having at least hydrogen (such as an alkyl group and an aromatic carbon hydride) or a fluoro group may be used. Alternatively, both an organic group containing at least hydrogen and a fluoro group may be used as a substituent. Polysilazane is formed of a polymer material containing a bond of silicon (Si) and nitrogen (N) as a starting material.

In particular, in the case of using an inorganic material for the first insulating layer 204, a surface of an object to be processed is oxidized or nitrided to form the first insulating layer 204 thereover. As a method for oxidization or nitridation, there is high density plasma treatment. The high density plasma treatment is carried out with a plasma density of $1 \times 10^{11}$ cm$^{-3}$ or higher, or preferably $1 \times 10^{11}$ to $9 \times 10^{15}$ cm$^{-3}$ using a high frequency such as microwaves (for example, frequency of 2.45 GHz). When plasma is generated with such conditions, a low electron temperature becomes 0.2 to 2 eV. In this manner, high density plasma which features a low electron temperature has active species with low energy of movement. Therefore, a film which receives less plasma damage and thus has less defects can be formed.

A substrate where up to the first sacrificial layer 203 is formed is provided in a deposition chamber which can perform such plasma treatment, thereby deposition treatment is performed with what is called an antenna and an object to be processed at a distance of 20 to 80 mm or more preferably 20 to 60 mm. With such high density plasma treatment, a low temperature process (a substrate temperature of 400° C. or lower) can be realized. Therefore, glass or plastic which has low heat resistance can be used as the insulating substrate 201.

Such an insulating layer can be formed in a nitrogen atmosphere or an oxygen atmosphere. The nitrogen atmosphere is a mixed atmosphere of nitrogen and rare gas or a mixed atmosphere of nitrogen, hydrogen, and rare gas. At least one of helium, neon, argon, krypton, and xenon can be used as the rare gas. The oxygen atmosphere is typically a mixed atmosphere of oxygen and rare gas, a mixed atmosphere of oxygen, hydrogen, and rare gas, or a mixed atmosphere of dinitrogen monoxide and rare gas. At least one of helium, neon, argon, krypton, and xenon can be used as the rare gas.

The insulating layer formed in this manner has high density and less damage to other films. An insulating layer formed by high density plasma treatment can be improved in the state of an interface which is in contact with the insulating layer. For example, the interface state with the surface to be processed can be improved by forming the first insulating layer 204 by, for example, high density plasma treatment. By forming such an insulating layer over a structure layer, a damage to the structure can be reduced.

Here, high density plasma treatment is employed for forming a gate insulating layer, however, high density plasma treatment may be applied to a semiconductor film. By the high density plasma treatment, the quality of the surface of the semiconductor film can be improved. As a result, the interface state can be improved and electronic characteristics of a semiconductor element can be improved.

Furthermore, high density plasma treatment can be used for forming the base film 202 also, as well as the first insulating layer 204.

Figure 3B:
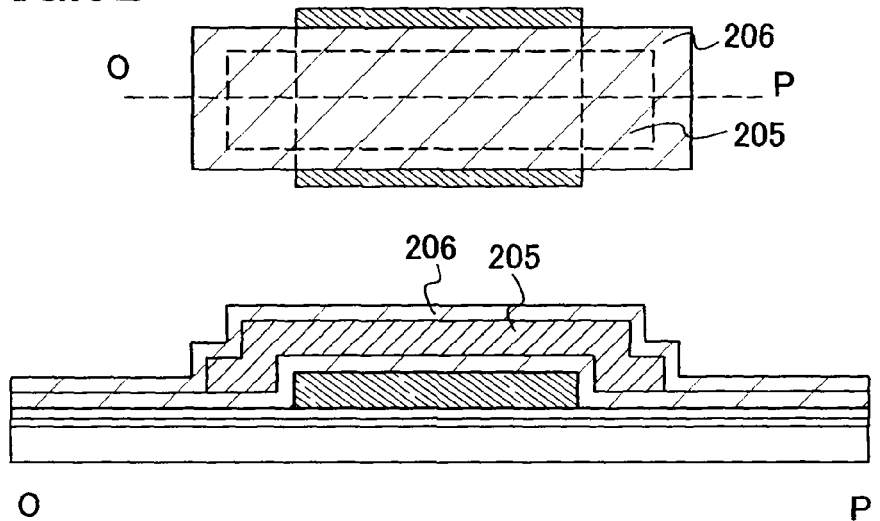

Next, as shown in FIG. 3B, a film containing polycrystalline silicon (structure layer) 205 is formed over the first insulating layer 204, thereby the second insulating layer 206 is formed so as to cover the layer 205. For the layer containing polycrystalline silicon (structure layer) 205, the aforementioned embodiment mode can be referred to. Moreover, the first insulating layer 204 can be referred to for the second insulating layer 206.

After that, the first insulating layer 204 and the second insulating layer 206 are patterned into desired shapes so that the sacrificial layer 203 is exposed (see the top plan view FIG. 3B).

Figure 3C:
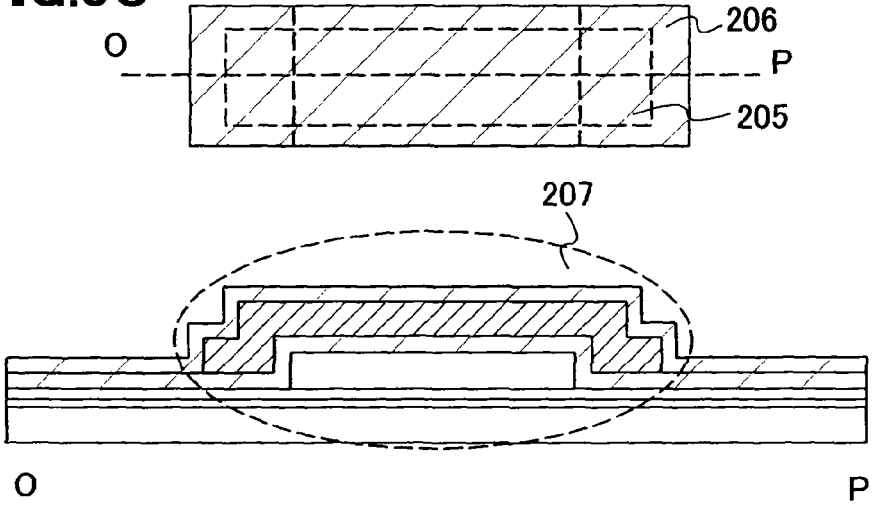

Next, the sacrificial layer 203 is removed by etching (see FIG. 3C). The aforementioned embodiment mode can be referred to for the etching of the sacrificial layer 203.

Figure 4A:
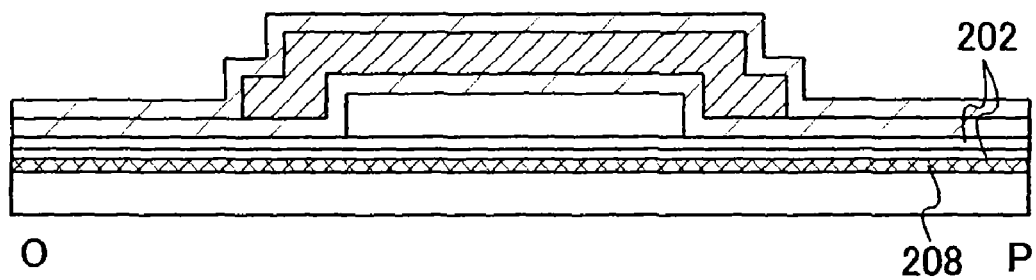
FIGS. 4A and 4B are views showing manufacturing steps of a microstructure of the invention.
Figure 4B:
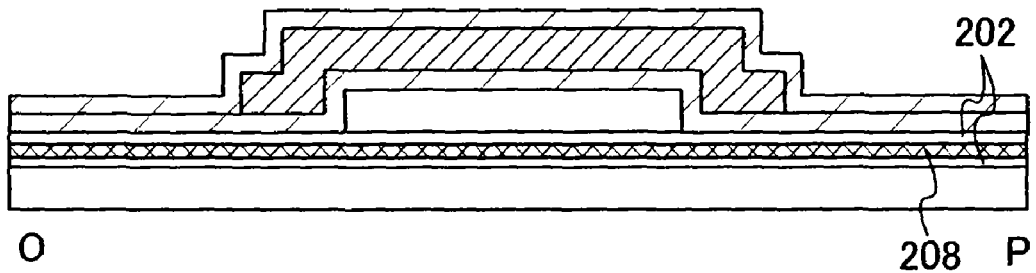

In the case where the structure 207 is movable by electrostatic force, a conductive layer 208 which can be used as a common electrode, a control electrode, or the like may be formed under the base film 202 (see FIG. 4A). Further, in the case where the base film 202 has a stacked-layer structure, the conductive layer 208 may be formed between the layers of the base film 202 (see FIG. 4B). The conductive layer 208 can be formed by a CVD method or the like using a metal such as tungsten or a substance having conductivity. Further, the conductive layer 208 may be patterned into a desired shape as required.

When a layer which forms the structure 207 has a pattern with corners when seen from the top, it is preferably patterned into a shape having rounded corners. This is similarly applied to the sacrificial layer 203 to be removed later. FIG. 9A is a top plan view where the conductive layer 208 and the sacrificial layer 203 are formed and patterned, and FIG. 9B is a sectional view thereof. By patterning the layer into a shape having rounded corners in this manner, dusts can be prevented and thus the yield can be improved.

It is to be noted that this embodiment mode can be freely implemented in combination with the aforementioned embodiment mode.

Embodiment Mode 3

In this embodiment mode, the microstructure formed in the aforementioned embodiment modes is described with reference to the drawings.

Figure 5:
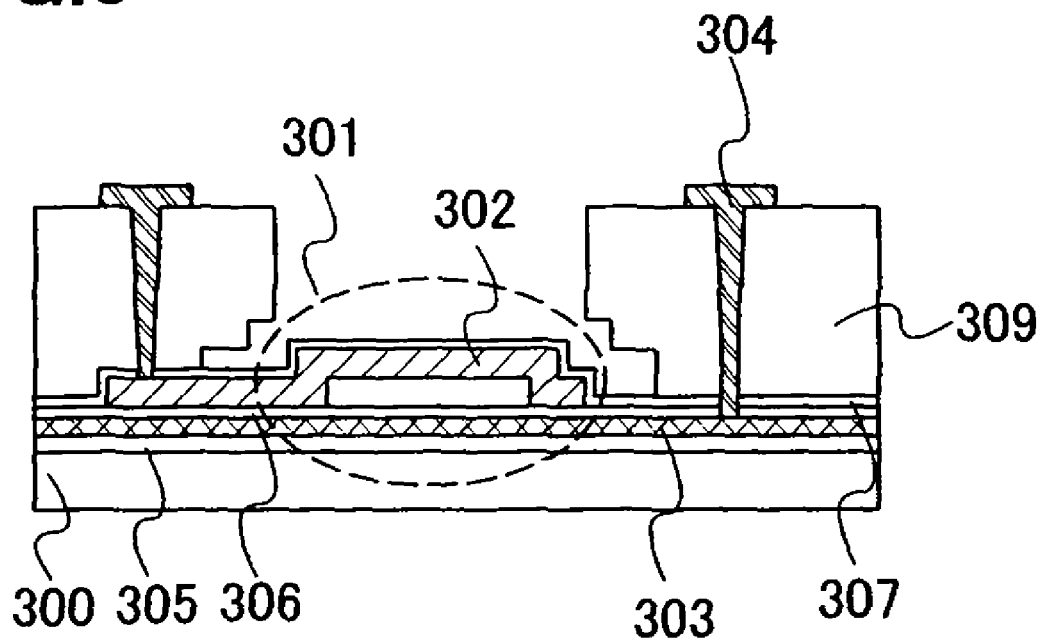
FIG. 5 is a view showing a structure of a microstructure of the invention.

FIG. 5 is a cross sectional view of a microstructure 301 formed by applying the manufacturing method of the microstructure described in the aforementioned embodiment mode. The microstructure 301 has a structure layer in which a base film 305, a first conductive layer 303, and a first insulating layer 306 are formed over a substrate 300. A structure layer formed by stacking a semiconductor layer 302 and a second insulating layer 307 is formed over the first insulating layer. A third insulating layer 309 is partially formed over the structure layer. A second conductive layer 304 is electrically connected to the first conductive layer and the semiconductor layer through a contact hole provided in the third insulating layer.

Here, when impurity elements or metal elements are added to the semiconductor layer 302 which forms the structure layer, the semiconductor layer 302 can have conductivity. Therefore, a capacitor (condenser) can be formed by the structure layer and the first conductive layer. The structure layer formed in this manner can move by receiving external force such as electrostatic force, pressure, and acceleration, which means that the aforementioned capacitor is a variable capacitor (variable condenser). Consequently, the microstructure 301 can function as a sensor of which capacitance changes when external force is applied thereto.

The microstructure shown in FIG. 5 can have the function of the sensor 16 which detects external force in the semiconductor device 11 shown in FIG. 6.

Moreover, in the microstructure 301 shown in FIG. 5, the structure layer can be formed to have a bimetal structure in which two kinds of substances with different coefficients of thermal expansion are stacked. In this case, the structure layer is movable by temperature change, therefore, the microstructure 301 can be used as a temperature detecting element as well.

Figure 8:
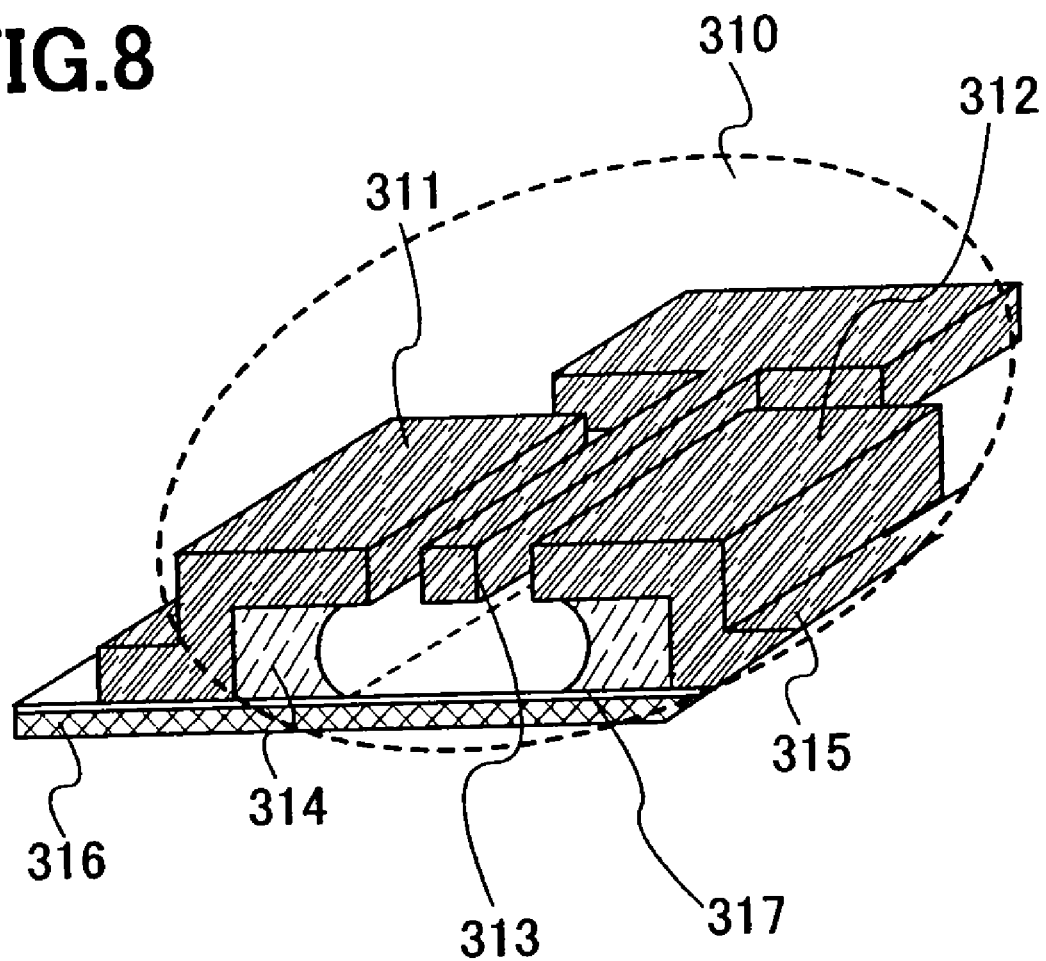
FIG. 8 is a view showing a structure of a microstructure of the invention.

FIG. 8 is a perspective view of a microstructure formed by applying the manufacturing method of the microstructure described in the aforementioned embodiment mode. The microstructure 310 has a structure layer 315 formed of a base film 317, a sacrificial layer 314, and a semiconductor layer over a substrate 316. In the microstructure 310, the sacrificial layer 315 forms an overhang beam 313 which is movable, a first electrode 311 and a second electrode 312 which are provided on both sides of the overhang beam 313. At least the sacrificial layer 314 formed under the overhang beam 313 which is movable is removed by etching.

The microstructure 310 formed in this manner can function as a switch in which the overhang beam 313 which is movable moves and contacts the first electrode 311 or the second electrode 312. Moreover, the microstructure 310 can be used as an angular momentum sensor which detects the Coriolis force generated in the microstructure 310 while a certain vibration is applied to the overhang beam 313 which is movable.

In the case of forming a switch using such a microstructure, a signal transmission path through the switch is completely insulated when the switch is turned off, while the signal transmission path with low resistance can be formed when the switch is on. The signal transmission path and a control system for controlling on/off of the switch can be insulated, thereby a switch with less insertion loss can be formed.

By changing a control method, the microstructure formed as described above may be used as an element or a sensor without changing the shape. Further, the microstructure formed as described above can function as an actuator by changing the control method. By using the aforementioned microstructure, the structure portion 13 in the semiconductor device 11 shown in FIG. 6 can be formed.

Embodiment 1

In this embodiment, an example of a manufacturing method of a structure layer formed of a semiconductor layer is described, such as the second structure layer 105 described with reference to FIGS. 1A to 2B in Embodiment Mode 1 and the structure layer 205 described with reference to FIGS. 3A to 4B in Embodiment Mode 2.

For example, as shown in FIG. 10A, the structure layer in the structure can be formed by stacking a layer containing polycrystalline silicon crystallized by the aforementioned steps and a layer containing amorphous silicon.

The silicon layers with different crystallinity such as the layer containing polycrystalline silicon and the layer containing amorphous silicon have different mechanical characteristics. Therefore, by forming a structure layer by stacking layers or forming layers in selected regions, a structure layer suitable for various applications can be formed.

<Measurement of Composite Elasticity and Indentation Hardness>

In order to measure the difference in mechanical characteristics between silicon layers with different crystallinity, the composite elasticity and indentation hardness of a layer containing amorphous silicon and a layer containing polycrystalline silicon formed by a CVD method were measured. Here, the layer containing polycrystalline silicon was formed by crystallizing a layer containing amorphous silicon by laser using a metal catalyst.

The layer containing amorphous silicon used as a sample was formed by forming a silicon nitride layer with a thickness of 50 nm as a base layer and a silicon oxide layer with a thickness of 100 nm over a quartz substrate as base layers by a CVD method, and an amorphous silicon layer was formed over the base layers by a CVD method. The layer containing polycrystalline silicon used as a sample was formed by crystallizing a layer containing amorphous silicon formed similarly to the aforementioned manner by using a continuous wave laser. Here, the laser energy density used for the crystallization was 9 to 9.5 W/cm² and the scan rate was 35 cm/sec. The layer containing amorphous silicon used as a sample was formed with a thickness of 66 nm while the layer containing polycrystalline silicon crystallized by laser irradiation had a thickness of about 60 nm.

The measurement was carried out by the nano-indentation measurement to compress an indenter having a triangular pyramid shape into the sample. The measurement was carried out with a condition of compressing a single indenter, which is a Berkovich indenter made of diamond. Therefore, the elasticity of the indenter is about 1000 GPa and the Poisson's ratio is about 0.1.

The measured composite elasticity is the elasticity obtained by combining the elasticity of the sample and the indenter, which is expressed by the following formula (1). In the formula (1), Er represents composite elasticity, E represents a Young's modulus, and v represents a Poisson's ratio. The first parenthesis (expressed as sample) of the formula is a parenthesis to which the elasticity of the sample contributes while the second parenthesis (expressed as indenter) is a parenthesis to which the elasticity of the indenter contributes.

As shown in the formula, the composite elasticity is found by the sum of the first parenthesis to which the elasticity of the sample contributes and the second parenthesis to which the elasticity of the indenter contributes. However, the elasticity of the indenter is quite higher than that of the sample, therefore, the second parenthesis can be ignored. As a result, the composite elasticity approximately equals to the elasticity of the sample.

The indentation hardness is hardness measured by an indentation method, which is obtained by dividing the maximum press weight by the projection area at the maximum press fit. Here, the projection area at the press is found by a geometric shape of the indenter and the depth of contact when the indenter is compressed to the sample. Multiplication of 76 to the indentation hardness can be equivalently treated as Vicker's hardness which is generally used as an index of hardness.

$$\frac{1}{Er} = \left(\frac{1-v^2}{E}\right)_{sample} + \left(\frac{1-v^2}{E}\right)_{indenter}$$ [Formula 1]

Chart 1 shows the measurement result of the composite elasticity and indentation hardness of the layer containing polycrystalline silicon and the layer containing amorphous silicon. The result shows average values of three times of the measurement.

As shown in Chart 1, the layer containing polycrystalline silicon has higher elasticity than the layer containing amorphous silicon. That is, when force to bend the structure is generated, the layer containing polycrystalline silicon can resist the breaking caused by bending better than the layer containing amorphous silicon.

Furthermore, as shown in the result in Chart 1, the layer containing polycrystalline silicon is harder than the layer containing amorphous silicon.

CHART 1

| Sample | Composite Elasticity (GPa) | Indentation Hardness (GPa) |
|---|---|---|
| Layer containing amorphous silicon | 141 | 15.5 |
| Layer containing polycrystalline silicon | 153 | 20.3 |

In this manner, by stacking semiconductor layers with different elasticity and hardness, a structure having flexibility and hardness which can resist bending force can be formed. For example, by stacking the aforementioned layers, even when a breaking occurs due to a crystal defect of the layer containing polycrystalline silicon, the breaking does not easily spread to the layer containing amorphous silicon. Therefore, the breaking can be stopped between the layer containing polycrystalline silicon and the layer containing amorphous silicon. In this manner, the balance of flexibility and hardness can be determined by the ratio of the thicknesses of the stacked layers.

As described above, a structure having a structure layer with a desired property such as flexibility, hardness, or conductivity can be formed by stacking or partially forming silicon layers or silicon compound layers with different properties. By using such a structure, a product having a desired property can be manufactured. For example, in the case of using a structure as a sensor, a sensor which detects within a desired region can be manufactured. Furthermore, a sensor which can detect a wide area can also be manufactured. A structure having a flexible structure layer is resistant to the breaking caused by bending, therefore, a structure and a product which have a long life can be manufactured as well.

This application is based on Japanese Patent Application Ser. No. 2005-160608 filed in Japan Patent Office on May 31 in 2005, the entire contents of which are hereby incorporated by reference.

What is claimed is:

1. A microstructure comprising:
    a first layer provided on an insulating surface; and
    a second layer provided over the first layer; and
    a space between the first layer and the second layer,
    wherein the second layer has a structure in which a layer containing polycrystalline silicon and a layer containing amorphous silicon are stacked,
    wherein the polycrystalline silicon includes a metal element selected from the group consisting of Ni, Fe, Ru, Rh, Pd, Os, Ir, Pt, Cu, and Au,
    wherein the layer containing polycrystalline silicon has higher elasticity than the layer containing amorphous silicon,
    wherein the second layer has a beam structure that has a pillar portion and a beam portion, and
    wherein the second layer and the space are stacked over the first layer.

2. The microstructure according to claim 1, wherein a layer comprising a metal, a metal compound, silicon, a silicon oxide, or a silicon nitride provided over the first layer is removed by an etching method to form the space.

3. The microstructure according to claim 1, wherein the second layer has a portion which does not contact either the insulating surface and the first layer.

4. The microstructure according to claim 1, wherein:
    a common electrode is provided under the first layer, and
    an insulating film is provided between the first layer and the common electrode.

5. The microstructure according to claim 1, wherein the beam portion of the second layer does not contact either the insulating surface or the first layer, and the beam portion of the second layer is provided apart from a portion of the first layer overlapped with the beam portion of the second layer at a distance of 0.5 microns to 3 microns.

6. The microstructure according to claim 1, wherein the first layer comprises polycrystalline silicon including the metal element.

7. The microstructure according to claim 1, wherein the beam portion of the second layer has a structure in which a layer containing polycrystalline silicon and a layer containing amorphous silicon are stacked.

8. A microstructure comprising:
a first layer provided on an insulating surface;
a second layer provided over the first layer;
a space between the first layer and the second layer; and
an insulating film formed between the space and the second layer,
wherein the second layer has a structure in which an amorphous silicon, a first polycrystalline silicon, and a second polycrystalline silicon are stacked, and wherein the second polycrystalline silicon is provided over the first polycrystalline silicon,
wherein the second polycrystalline silicon includes a metal element,
wherein the second layer is moved by pressure, electrostatic force, or electromagnetic force, and
wherein the first layer is fixed to the insulating surface.

9. The microstructure according to claim 8, wherein a capacitor is formed by the first layer and the second layer.

10. The microstructure according to claim 8, wherein the first polycrystalline silicon is provided over the amorphous silicon.

11. The microstructure according to claim 8, wherein the second polycrystalline silicon has higher elasticity than the amorphous silicon.

12. The microstructure according to claim 8, wherein the first layer comprises polycrystalline silicon including the metal element.

13. The microstructure according to claim 8, wherein the amorphous silicon of the second layer is in contact with the first layer.

14. The microstructure according to claim 8, wherein the second layer has a beam portion and a pillar portion, and
wherein the beam portion has a structure in which the amorphous silicon, the first polycrystalline silicon, and the second polycrystalline silicon are stacked.

15. A microstructure comprising:
a first layer on an insulating surface;
a second layer comprising polycrystalline silicon over the first layer; and
an insulating film formed over the second layer,
wherein at least one of the first and second layers comprises polycrystalline silicon including a metal element,
wherein the second layer has a beam portion and a pillar portion,
wherein the beam portion of the second layer does not contact either the insulating surface or the first layer and is at a distance of 0.5 microns to 3 microns from either the insulating surface or the first layer,
wherein the pillar portion of the second layer is in contact with the first layer,
wherein the pillar portion of the second layer is amorphous silicon, and
wherein the beam portion of the second layer is polycrystalline silicon.

16. The microstructure according to claim 15, wherein the pillar portion of the second layer is in contact with the beam portion of the second layer.

* * * * *